United States Patent
Ott

(10) Patent No.: US 6,424,163 B1
(45) Date of Patent: Jul. 23, 2002

(54) TEST FIXTURES FOR CONTACTING ASSEMBLED PRINTED CIRCUIT BOARDS

(75) Inventor: Rainer Ott, München (DE)

(73) Assignee: Test Plus Electronic GmbH (DE)

( * ) Notice: Subject to any disclaimer, the term of this patent is extended or adjusted under 35 U.S.C. 154(b) by 0 days.

(21) Appl. No.: 09/510,474

(22) Filed: Feb. 23, 2000

(30) Foreign Application Priority Data

Feb. 23, 1999 (DE) .......................................... 199 07 727

(51) Int. Cl.⁷ .............................................. G01R 31/02
(52) U.S. Cl. ...................................................... 324/754
(58) Field of Search ................................ 324/754, 761; 439/482, 65, 66, 700

(56) References Cited

U.S. PATENT DOCUMENTS 5,557,213 A * 9/1996 Reuter et al. ............... 324/761
6,208,158 B1 * 3/2001 Schein et al. ............... 324/761

* cited by examiner

Primary Examiner—N. Le
Assistant Examiner—Etienne LeRoux
(74) Attorney, Agent, or Firm—Scully, Scott Murphy & Presser

(57) ABSTRACT

Test fixture for contacting assembled printed circuit boards 3 with a probe plate 1 for holding test probes 5, 19 arranged closely side by side (5, 19), with a first type of test probes 5 held from receptacles 4 inserted into the probe plate 1, into which contact elements 6, 7 are inserted from below towards the test probes 5, and with a smaller diameter second type of test probes 19, which are arranged without receptacles 4 in the probe plate 1 and which are shaped at their lower end as hollow probes for the reception of insertable contact elements 20, 25, the insertable 10 contact elements (20, 25) being fixed in additional assembly-plates 21, 22.

11 Claims, 6 Drawing Sheets

TEST FIXTURES FOR CONTACTING ASSEMBLED PRINTED CIRCUIT BOARDS

FIELD OF THE INVENTION

The present invention concerns test fixtures for assembled printed circuit boards with an assembled printed circuit board mounted on a probe plate and to be tested and with a probe plate supporting test probes.

BACKGROUND OF THE INVENTION

Test fixtures for assembled printed circuit boards are predominantly used in conjunction with automatic test systems and make possible an individual quickly changeable electrical connection between the circuit board and the connecting interface of the test systems. Depending on the size of the circuit boards and test methods 200 up to about 5000 test points are simultaneously contacted with one test fixture.

The construction of a test fixture is illustrated in principle in FIG. 2a. Into a probe plate 1 tightly mounted receptacles 4 are seated, into which test probes 5 are inserted. The test probes 5 are mostly held in the receptacles 4 by a clamping fixation (for example at reduced cross-section of the receptacles 4) and have preferably an internal, spring-loaded movable plunger 8 forming the test prod of the test probe 5. Correspondingly to the distance of the test points 11 on the circuit board 3 to be tested and to the resulting distance of the contact points 11 to each other test probes 5 and receptacles 4 are of varying diameter. Today versions are usual, which are designed for a distance of up to 100 mils (2.54 mm), 75 mils (1.79 mm), 50 mils (1.27 mm) respectively each.

For contacting, the specimen 3 fixed on a probe plate 2 is preferably pressed against the movable plungers 8 forming the test prods of the test probes 5 either by vacuum or by mechanical push down fingers in such way that the test probes 5 contact the contact points 11.

The underside of the receptacles 4 is mostly provided with a contact element 6 having a wire wrap post. The receptacles 4 are then wired up from the wire wrap post to the interface.

In case of alternative embodiments, so-called adapters without wiring (FIG. 2b), the receptacles 4 have also a spring contact element 7 at the underside and contact either (not shown in the drawing) an individually manufactured connection board or a universal grid board from a so-called interface cassette.

The test probes 5 must be replaceable easily and very quickly in case of defect or wear, because a defective test fixture causes immediately a standstill of production in an automated production line and consequently high costs.

The costs of the test probes 5 increase overproportionately with decreasing diameter of the test probes 5. Stability and life decrease plainly at test probes 5 getting smaller. In case of probe 5 suitable for the 50 mil grid measure the internal moved plunger 8 and the spring 5 reach already diameters of about 0.45 mm.

The progressing miniaturisation and with it the increasing closeness of the contact points 11 on the specimen 3 therefore necessitates the search for alternative solutions to achieve in case of small distance of the test probes to each other possibly high stability and reasonable costs of the test probes 5.

Since many years test probes 12 are known on the market, where, as shown in FIG. 3, in order to reduce the total diameter connection pins 13 are fixed in the probe receptacle 14 clamping from below.

Because here the external diameter of the receptacle 4 tightly mounted enlarges no more the total diameter (in case of the test probe 12 illustrated in FIG. 3, a tightly mounted receptacle 4 for test probe 12 is not necessary for the purpose of contacting), so test probes 12, which are applied in case of assembling with receptacles 4 only for a minimal grid of 75 mils (1.79 mm), can be used up to a distance of 50 mils (1.27 mm) in case of assembling without tightly mounted receptacles, and previous 50 mil test probes 12 can be used up to a distance of 40 mils (1 mm).

It is a disadvantage of this method, however, that the replacement of probes is made considerably more difficult. While in case of the conventional fixing method, where the test probes 5 are held in the tightly mounted receptacles 4 by frictional resistance and contact them, the test probes 5 can be easily taken from above from the tightly mounted receptacles 4 without opening the internal part of the adapter (for example the wiring area of the contact elements 6, 7), and can be inserted again into the tightly mounted receptacles 4, in case of the test probes 12 described in FIG. 3 an opening of the wiring area made inaccessible for the non-specialist is necessary to remove or replace the test probes 12 in order to draw first the connecting pin 13 from the receptacle 14. After that the test probes 12 can be pulled out of the probe plate 1 from above and be replaced. After inserting a new test probe 12 into the probe plate 1 from above the wiring area has to be opened again in order to insert the connecting pin 13 back into the receptacle 14.

The replacement of all test probes 12, which is necessary in regular time intervals in case of a high number of boards to be tested, will be considerably more complicated, because each replacement has to be executed individually and with access to the wiring area and to the top side of the probe plate 1 of the test fixture.

A further disadvantage is the only incomplete reduction of the diameter, because in order to prevent a slipping of the test probe 12 downwards (i.e., towards the wiring area) through the probe plate 1 an additional retaining ring 15 on top of the probe plate 1at the test probe 12 is necessary.

An alternative known solution, which avoids the disadvantages named above, is illustrated in FIG. 4. Also here, test probes 5 are used, which are not carried in tightly mounted receptacles 4, but directly in bores, which are placed in a preferably particularly thick probe plate 1. The test probes 5 free to move in the bores in axial direction are supported with their lower end (averted from the test prod) by the contact parts 17 mounted on a probe plate 16, and consequently in testing the test probes 5 are pressed against the contact parts 17 by the pressure force of the specimen 3 to the test probes 5.

A disadvantage of this solution is at first the additional contact interface between the test probes 5 and the contact parts 17 necessary for the accessibility of the adapter, because now the test probe is no more connected tightly in frictional resistance with the contact parts 17 replacing of the receptacles 4. This transition contact is loaded at any change of specimen 3, i.e., up to several hundred thousand times during the life of an adapter, and therefore it involves the risk of additional contact failures and increased contact transition resistance respectively.

A further disadvantage arises by the fact that in order to achieve the necessary contact spring force a clearance fit of the test probes 5 in the bores in the probe plate 1 must be ensured in any case to transfer the contact pressure on plunger 8 of the test probe to the contact location on the contact part 17. Resulting from manufacturing tolerances hardly avoidable in the manufacturing of the test probes 5 and in making the bores the required clearance fit necessitates a considerably larger wobbling clearance of the probes 5.

It is a third disadvantage that either in the first manufacturing of the test fixture and also in later alterations expensive provisions have to be made (for example deposition of an elastic holding layer 18 consisting of an elastic material on the probe plate 1), so that the test probes 5 will not be pulled out after testing, when the circuit board is taken off. This danger exists, because for the test of circuit boards 3 soldered with soldering wave and therefore contaminated with remains of flux particularly very sharp probes are necessary, which often hook up in the softer solder.

Because furthermore from several reasons the concept described above cannot be combined with the known receptacle technique (for example the contact elements 6,7 of the receptacles 4 placed in the probe plate 1 and the probe plate 16 for the contact parts 17 would stand in the way of each other) all contact connections of the test fixture have to be designed in the way described in connection with FIG. 4. Therefore the above named disadvantages do not only have an effect on the typically 5 to 10% of the probe positions with a resolution required particularly high (high closeness of the test probes 5), but on 100% of the test probes 5 used.

SUMMARY OF THE INVENTION

It is the task of the present invention to propose a test fixture for contacting assembled printed circuit boards, where the test probes are replaceable easily and fast also without specialised knowledge, and where, using test probes with possibly large diameter (and therefore possibly stable and cheap test probes) a maximal resolution, i.e., a minimal distance of the test probes and therefore of the possible test points to each other can be achieved. It is furthermore the task of the invention to propose a test fixture, where the wobbling clearance of the test probes is reduced, and additional contacting failures and increased contact transition resistance can be avoided, and where the test probes are secured against inadvertent slipping out furthermore without additional measures.

To remove the existing disadvantages the present invention proposes an test fixture concept, where in the regions of the total test probe area, in which only an average resolution is needed an test locations and in which there a middle distance of the test probes is sufficient, the advantageous and proven technique of clamping test probes 5 of the first type and the receptacles 4 is used. In the regions of the total test probe area, where a higher resolution of the test locations and consequently a reduced distance of the test probes is needed, additionally or alternatively to the test probes 5 of the first type inserted into the receptacles 4 further test probes 19 of the second type are used according to the present invention, the test probes 19 of the second type without receptacles 4 being arranged in bores in the probe plate 1, and consequently the diameter saved from leaving out the receptacles can come in useful for the test probes totally or partially.

The test probes 19 of the second type are designed here at least at their lower end averted from the circuit board 3 to be tested as hollow probes for the reception of an insertable contact element 20, 25. The insertable contact elements 20, 25 are fixed in additional assembly-plates 21, 22 in a distance from the probe plate 1 and can be connected electrically with a terminal. The assembly-plates are preferably connected on the one or more receptacles 4 of one or more adjoining test probes 5 of the first type or directly connected with the probe plate 1 from a distance piece 26.

It is advantageous along with the use of the advantageous and proven technique of clamping test probes 5 of the first type and the receptacle 4 so that the possibility of an easy change of the test probes by drawing and inserting the testprobes 5, 19 from the side of the probe plate 1 turned towards the circuit board to be tested is maintained. A further important advantage of the solution according to the invention is the possibility of a combination with the existing receptacle assembling so that furthermore the existing and economical production engineering for positions with "normal" requirement to the closeness of the test probes 5, 19 distance will be at disposition.

BRIEF DESCRIPTION OF THE DRAWINGS

One embodiment of the invention is described in more detail with reference to the drawing. In the drawing

DETAILED DESCRIPTION OF THE EXEMPLARY EMBODIMENTS

Figure 1:
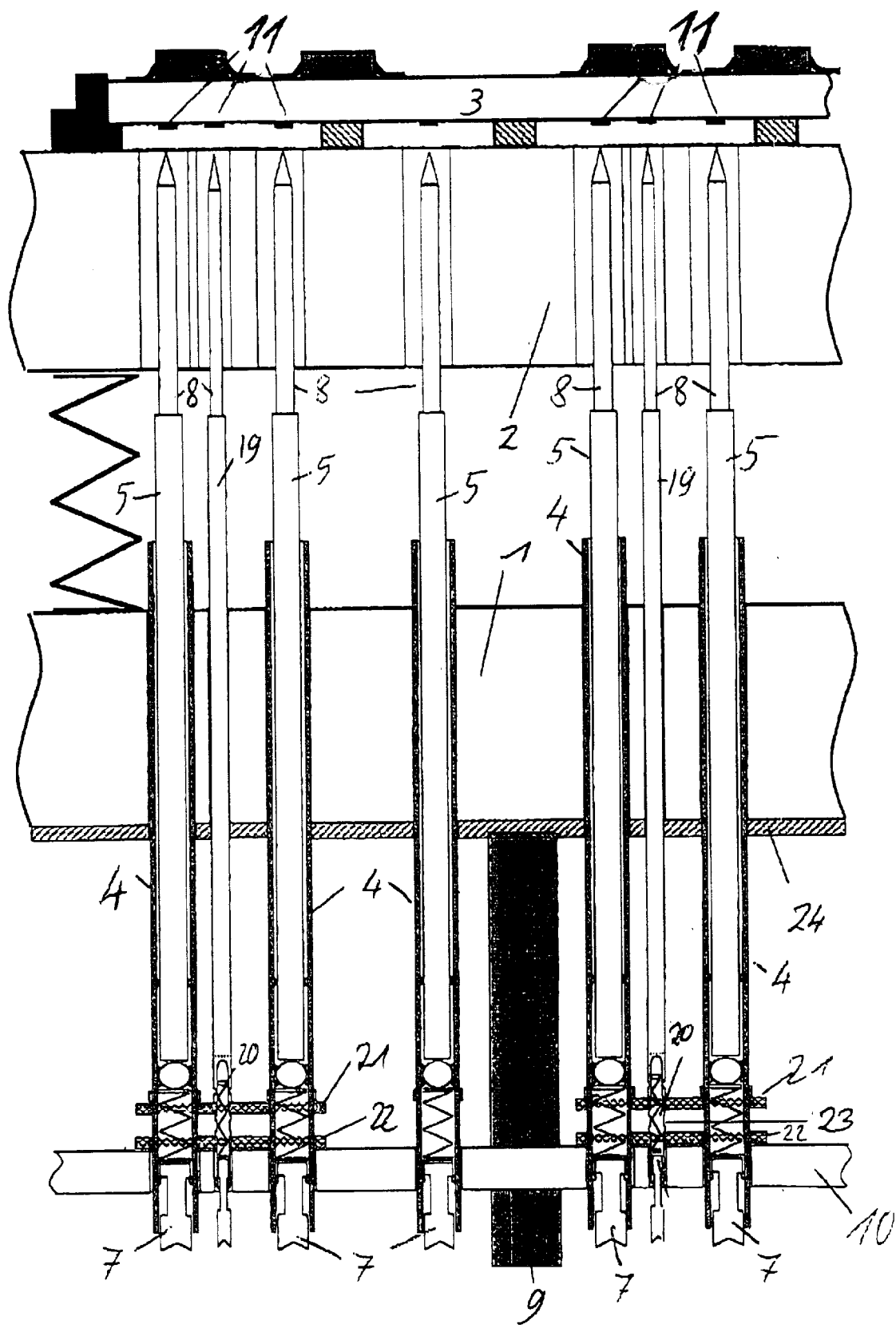
FIG. 1 illustrates a cross-section of a test fixture according to the invention, which is equipped with spring contact elements 7, 20.
Figures 2A, 2B:
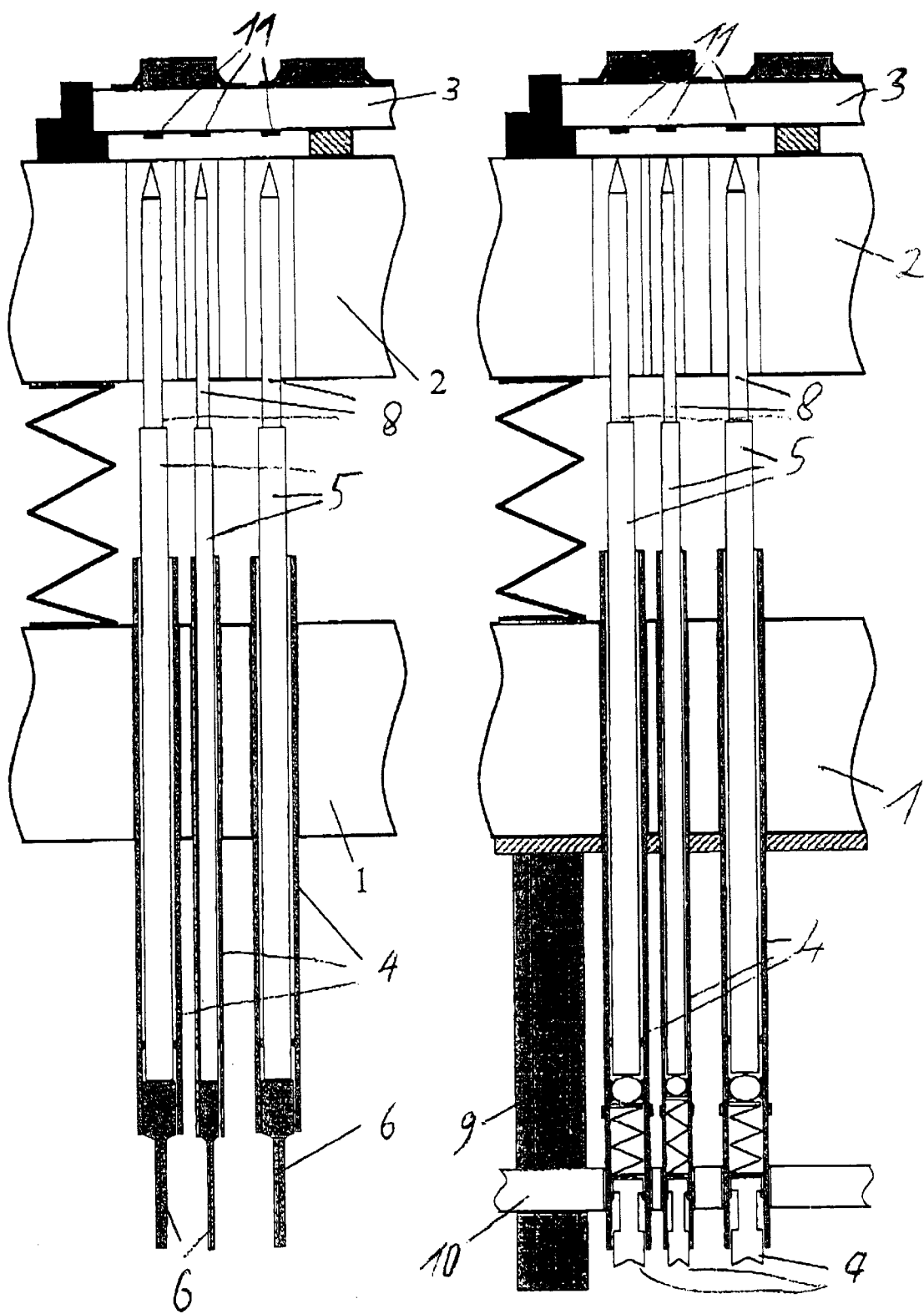
FIGS. 2*a*, 2*b* illustrates a cross-section of a test fixture according to the state of the art technology.
Figure 3:
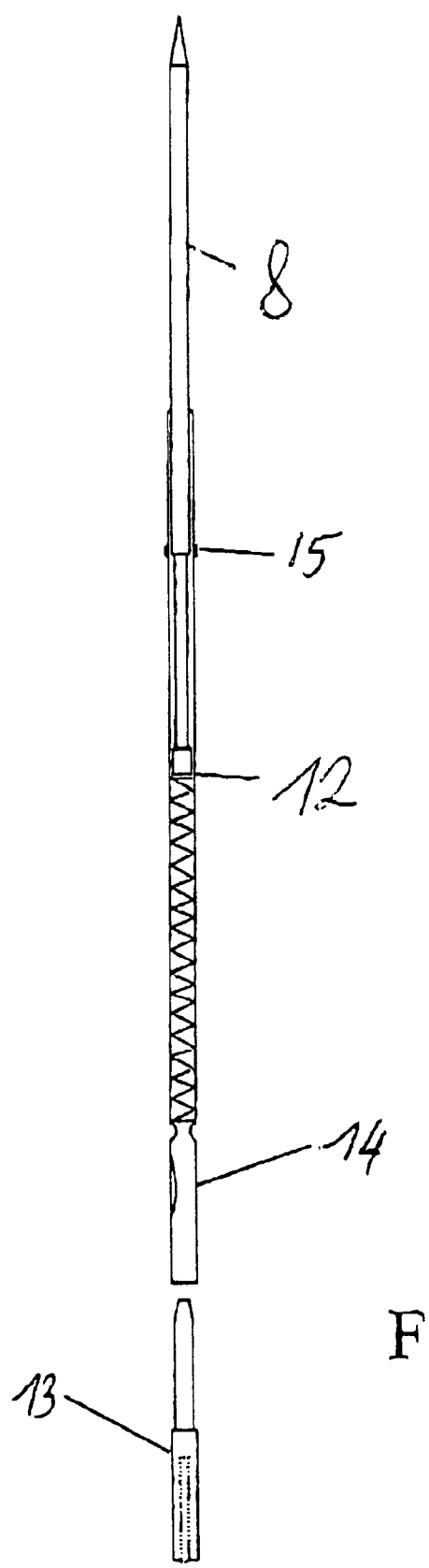
FIG. 3 illustrates a test probe corresponding to the state of the art technology.
Figure 4:
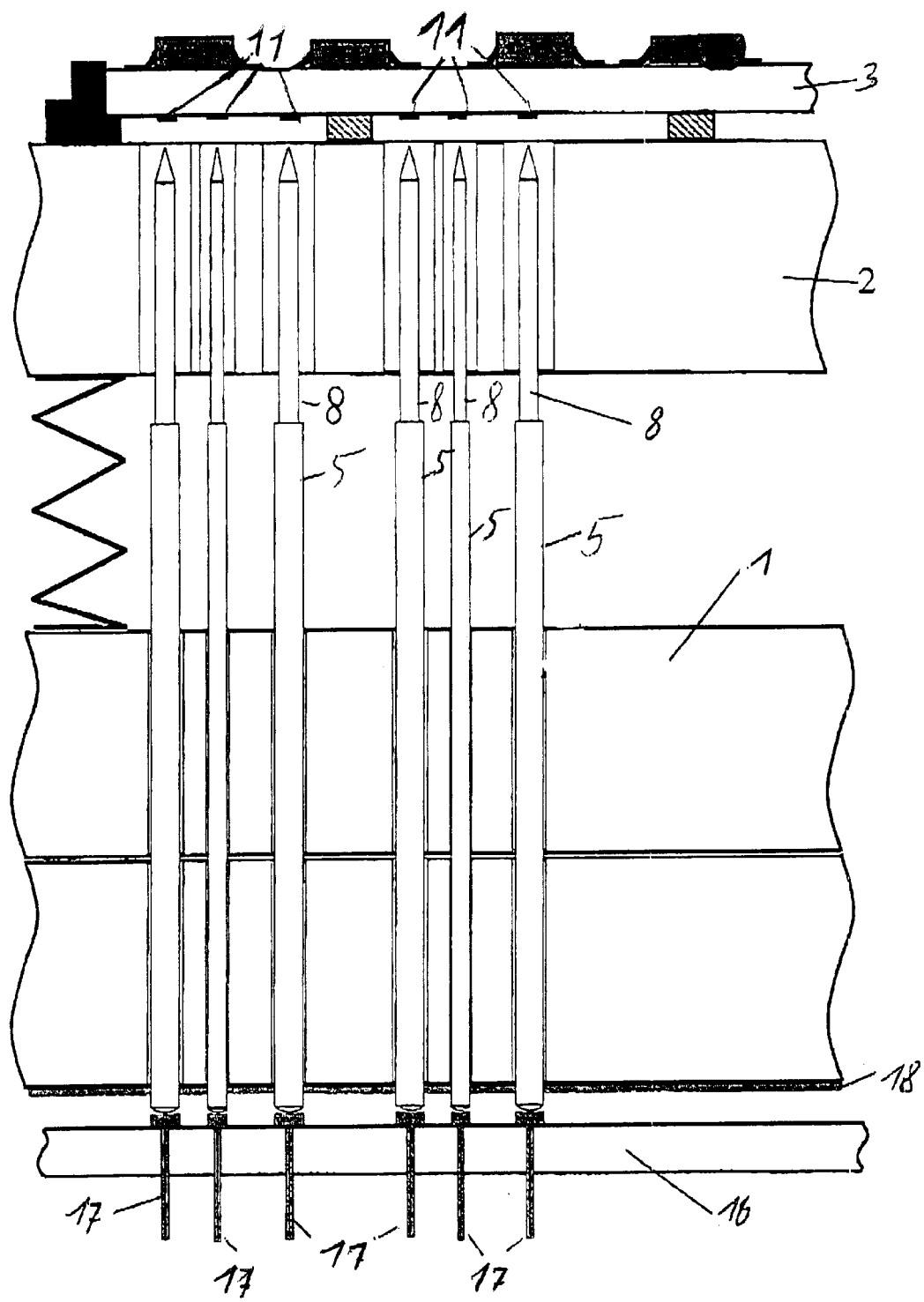
FIG. 4 illustrates a cross section of a further test fixture according to the state of the art.

FIG. 1 represents the solution according to the invention in an embodiment, where tightly mounted receptacles 4 with spring contact elements 7 are used. The receptacles 4 are supported by the probe plate 1 in bores and are provided with spring contact elements 7 at their lower end. For better positioning the spring contact elements the lower ends of the receptacles 4 are guided by supporting plate 10 connected with the probe plate 1from distance pieces 9. Test probes 5 of the first type can be inserted into the receptacles 4 so that they can be kept in the receptacles 4 by frictional resistance. Furthermore the test fixture according to the invention has a second type of test probes 19, which are arranged without the receptacles 4 in bores in the probe plate 1 and which at least at their lower end are designed as hollow probes for the reception of insertable spring contact elements 20, the insertable spring contact elements 20 being fixed in additional assembly-plates 21, 22.

Preferably one or more assembly-plates 211, 22 independent from each other and distributed over the total probe area are provided, which cover merely the area of extremely small probes, i.e., the area of an particularly high closeness of test points and consequently also test probes 5, 19. The contact elements 20, 25 fixed in the assembly-plates 21, 22 are shaped in such way that they are suitable to a clamping fixation of the test probes 19 in form of a frictional resistance. Depending on the version the contact elements 20 are connected with the assembly-plates 21, 22 removable or permanently.

Figure 5:
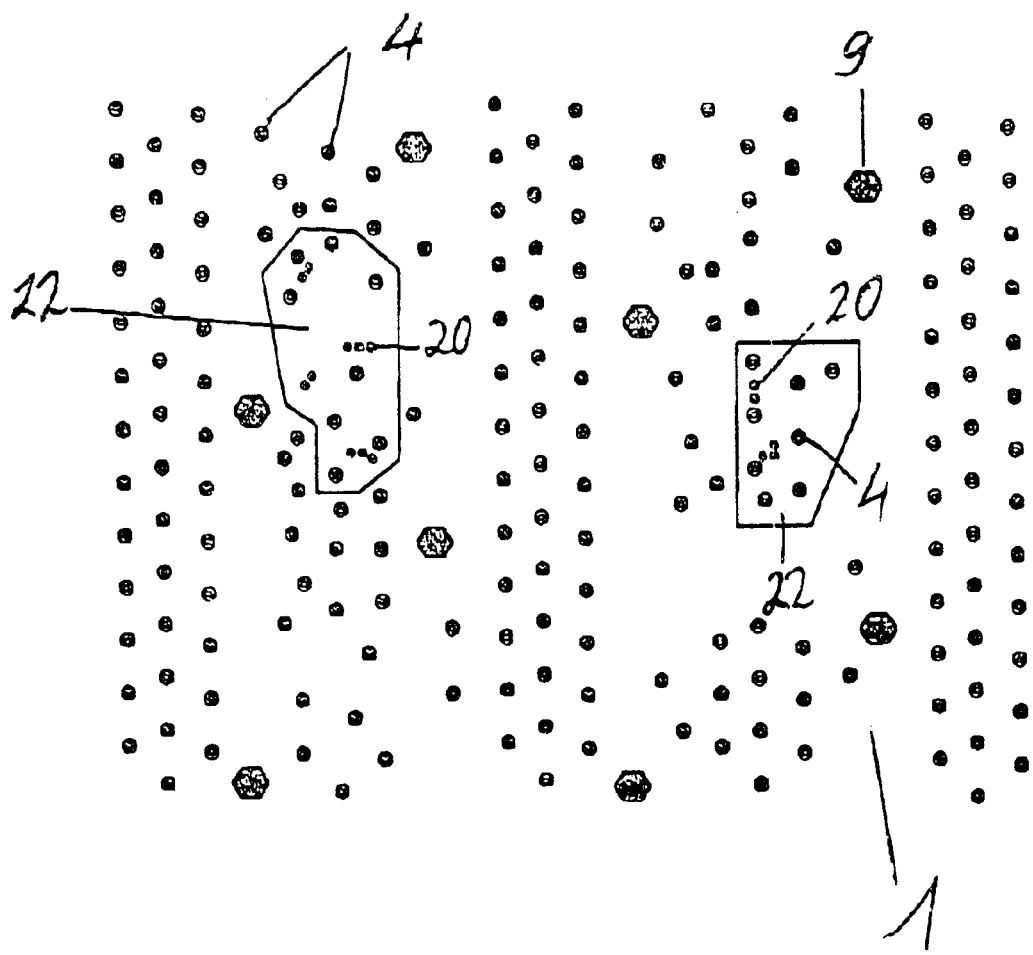
FIG. 5 illustrates a top view of probe plate 1 of a test fixture according to the invention from the side averted from the circuit board to be tested.

An example of the arrangement of these assembly-plates 21, 22 on the total test probe area is shown in FIG. 5, in which the probe plate 1(without supporting plate 10 for the receptacles 4) is illustrated from below.

As can be seen well, the assembly-plates 21, 22 extend only over areas with extremely high closeness of test probes 5, 19 and consequently over areas with particularly small test probes 19. Along with the receptacles 4 for the test probes 5 of the first type contact elements 20, 25 for the test probes 19 of the second type, lower assembly-plates 22 carrying the contact elements 20, 25, as well as distance pieces 9 for the supporting plate 10 not represented are illustrated in FIG. 5.

A particularly simple version of assembling the assembly-plates 21,22 results, if as well as for determining the position as also for determining the height of the assembly-plates 21, the fixation will be done from the existing larger receptacles 4 tightly mounted in the probe plate 1 and eventually from a supporting plate 10 connected from distance pieces 9 with the probe plate 1.

The determination of the boring and cutting data is made in meaningful manner from an appropriate software program.

In order to achieve a good spring effect and consequently contact of the contact element 20, 25 having frictional resistance to the second type of test probes 19 it is advantageous to design the contact element 20, 22 in the contact area, so in the area, where the contact element 20, 25 reaches in the hollow probe of the test probe 19, as hollow part, because a better clamping force can be built up between the test probe of the second type and the contact element 20, 25 without danger of remaining deformation.

A high friendliness to alterations and flexibility results, if the contact elements 20, 25 are fixed between two assembly-plates 21 and 22. In case of very small contact elements 20, 25, where a spring contact element version is not advisable, both assembly-plates 21, 22 arranged parallel on top of each other, distant from each other form a separate protected wiring space. The middle area 23 of the contact element 20, 25 is then preferably tapered for the purpose to solder there for example a thin insulated wire (for example enamelled copper wire) in order get wired connections to further contact elements 20, 25.

If later on probe positions have to be set, the assembly-plates can be dismantled with a justifiable lot of work and optionally rebreed or replaced by newly bored assembly-plates.

Since the test probes 19 are kept and supported at their lower end by the contact elements 20, 25, no additional retaining rings 15 are necessary on the test probes 19. With a bore accordingly precise, consequently a test probe 19, which in case of a conventional test fixture can be used with receptacles 4 up to a distance of 75 mils, is usable up to 45 mils, and a test probe, which in case of a conventional test fixture can be used with receptacles 4 up to a distance of 50 mils, is usable up to 35 mils.

In case of vacuum operated adapters an additional sealing of the test probes 19 is provided. Here, an elastic material layer is deposited preferably below the probe plate 1 and the bores 30 in the probe plate 1 are made in such way that the wall of the elastic sealing layer 24 encloses tightly the test probes 19.

Figure 6:
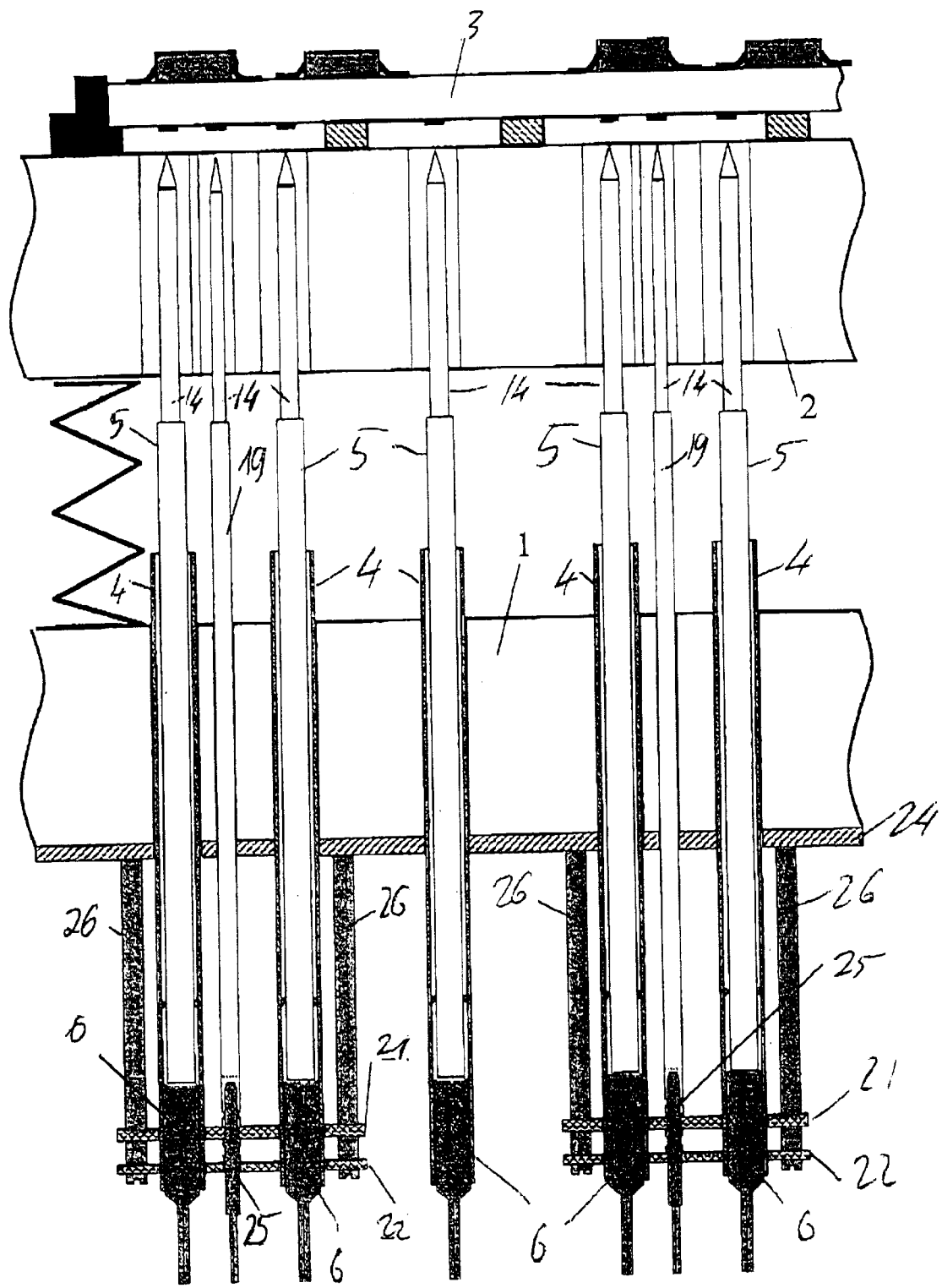
FIG. 6 illustrates a cross-section of a test fixture according to the invention, which is equipped with contact elements 6, 25 having wire wrap posts.

FIG. 6 shows an alternative embodiment of wiring according to wire wrap technique. The assembly-plates 21, 22 are moved over the receptacles fixed already in the probe plate 1. Also here a design with two assembly-plates 20 and 21 was chosen. Because here the assembly-plates 21, 22 cannot be supported by an existing supporting plate 10 for the receptacles 4, they are fixed on the probe plate 1 preferably from screwed distance pieces 26. The upper part of the contact element 25 illustrated here corresponds to the spring contact element 20 described above, but upwards a wire wrap post is provided instead of a spring-loaded contact.

Also here the use of several assembly-plates 21, 22 spatially separated from each other offers the advantage that the free area remains flexible with regard to possible alterations, and place remains for special attachments eventually necessary and for the wiring as in case of conventional adapters.

What is claimed is:

1. Test fixture for contacting assembled printed circuit boards with a probe plate for holding test probes arranged closely side by side,
    with a first type of test probes held from receptacles inserted into the probe plate, into which contact elements are inserted from below into the receptacles towards the test probes, the receptacles being fixed in assembly plates,
    and with a second type of test probes with a diameter less than the diameter of said first type of test probes, the second type of test probes being arranged without receptacles in the probe plate, the second type of test probes being shaped at least at their lower end as hollow probes for the reception of insertable contact elements, the insertable contact elements being fixed in the assembly-plates.

2. Test fixture according to claim 1,
    wherein a plurality of independent assembly-plates is provided, the assembly-plates each comprising an area of the test probes of the second type lying together.

3. Test fixture according to claim 2,
    wherein the assembly-plates for the contact elements of the test probes of the second type are fixed on one or more receptacles of adjoining test probes of the first type for at least one of guiding and holding.

4. Test fixture according to claim 2,
    wherein the assembly-plates are supported by distance pieces fixed on the probe plate.

5. Test fixture according to any one of claims 1 to 4, further comprising a sealing layer consisting of an elastic material on the probe plate.

6. Test fixture according to any one of claims 1 to 4, wherein the contact elements fixed on the assembly plates for the test probe of the second type are an elastically deformable contact part, which are inserted into hollow probes formed at the lower end of the test probes of the second type, with one at least in the insert area inside hollow section.

7. Test fixture according to any one of claims 1 to 4, wherein the contact element is a wire wrap post on its end averted from the test probe of the second type.

8. Test fixture according to any one of claims 1 to 4, wherein the contact element is a spring contact element on its end averted from the test probe of the second type.

9. Text fixture according to claim 8, wherein the contact element is removably positioned between two assembly plates distant from each other and arranged parallel on top of each other.

10. Text fixture according to any one of claims 1 to 4, wherein the middle part of the contact element further comprises fastening means for fastening an additional connecting wire.

11. Text fixture according to any one of claims 1 to 4, further comprising pre-confectioned connecting cables attached to the contact element.

* * * * *